US008222794B2

(12) United States Patent
Dong et al.

(10) Patent No.: US 8,222,794 B2
(45) Date of Patent: Jul. 17, 2012

(54) ULTRASONIC ATOMIZATION CIRCUIT AND AN ATOMIZATION DEVICE USING THE SAME

(75) Inventors: Xiaoyong Dong, Guangdong (CN); Linlin Pi, Guangdong (CN); Yihong Sun, Guangdong (CN); Jianwei Liu, Guangdong (CN)

(73) Assignee: Shenzhen H & T Intelligent Control Co., Ltd., Shenzhen, Guangdong (CN)

( * ) Notice: Subject to any disclaimer, the term of this patent is extended or adjusted under 35 U.S.C. 154(b) by 192 days.

(21) Appl. No.: 12/710,411

(22) Filed: Feb. 23, 2010

(65) Prior Publication Data

US 2011/0204160 A1 Aug. 25, 2011

(30) Foreign Application Priority Data

Sep. 1, 2009 (CN) .......................... 2009 1 0189841

(51) Int. Cl.
*H01L 41/09* (2006.01)

(52) U.S. Cl. ...................................................... 310/317

(58) Field of Classification Search .................. 310/317
See application file for complete search history.

(56) References Cited

U.S. PATENT DOCUMENTS

| | | | | |
|---|---|---|---|---|
| 4,642,581 | A * | 2/1987 | Erickson | 331/154 |
| 4,965,532 | A * | 10/1990 | Sakurai | 331/4 |
| 5,216,338 | A * | 6/1993 | Wilson | 318/116 |
| 7,969,064 | B2 * | 6/2011 | Vogeley et al. | 310/317 |

* cited by examiner

*Primary Examiner* — Thomas Dougherty
(74) *Attorney, Agent, or Firm* — Jackson IPG PLLC

(57) ABSTRACT

An ultrasonic atomization circuit comprises a driving signal generating unit to generate an ultrasonic driving signal, a power unit to amplify and transmit the ultrasonic driving signal to a piezoelectric ceramic lamination, and a buffering unit connecting to the driving signal generating unit and the power unit to reduce the effect by the load of the power unit to the driving signal generating unit. The present invention is directed to provide an atomization device using the above ultrasonic atomization circuit. For the ultrasonic atomization circuit being disposed between the power unit and the driving signal generating unit, the ultrasonic atomization circuit can reduce the effect by the disperse circuits and reactance to the driving signal generating unit, meanwhile need less units and be easy to test.

14 Claims, 2 Drawing Sheets

ULTRASONIC ATOMIZATION CIRCUIT AND AN ATOMIZATION DEVICE USING THE SAME

BACKGROUND OF THE INVENTION

1. Field of the Invention

This invention is related to an electronic circuit, especially to an ultrasonic atomization circuit and an atomization device using the same.

2. Description of the Related Art

An ultrasonic atomization device essentially is a high power ultrasonic piezoelectric ceramic oscillator, whose core consists of an atomization device and an electronic circuit. The frequency of the oscillator is determined by the inherent frequency of the atomization device. When the atomization device is working, the atomization device is vibrating in the water with a frequency of ultrasonic in order that the water molecules make an intense collision to generate gas. The power of the atomization device is not determined by the atomization device, but the oscillator. A traditional ultrasonic atomization circuit is shown in FIG. 1, a power is supplied to circuit through a voltage reduction voltage (36V) by a transformer B (AC220V/30 W), rectification by D1-D4 and filtration by the capacitor C5, capacitor C6. The circuit includes an oscillator, a transducer and a water level control unit. The three-point oscillator circuit includes a transistor BG1 and capacitors C1, C2. A resonance frequency of the equivalent parallel C1 and L1 is lower than the work frequency, which determines the oscillation amplitude of the oscillator. The resonance frequency of the equivalent parallel C2 and L2 is higher than the work frequency, which determines feedback quantity of the oscillation. The piezoelectric ceramic lamination TD has a huge equivalent inductance to determine both the work frequency of the circuit and the work load of the atomization device. However, the circuit has a lot of disadvantages, such as a lot of units, complicated parameter, hard to test.

SUMMARY OF THE INVENTION

The present invention is directed to provide an ultrasonic atomization circuit.

The present invention is directed to provide an atomization device using the above ultrasonic atomization circuit.

According to an embodiment of the present invention, an ultrasonic atomization circuit is provided. The ultrasonic atomization circuit includes a driving signal generating unit to generate an ultrasonic driving signal, a power unit to amplify and transmit the ultrasonic driving signal to a piezoelectric ceramic lamination, and a buffering unit connecting to the driving signal generating unit and the power unit to reduce the effect by the load of the power unit to the driving signal generating unit.

The driving signal generating unit includes a square-wave generating circuit formed by not gate units, and the square-wave generating circuit includes a first not gate unit and a second not gate unit, the output of the first not gate unit connects to its input sequentially through an adjustable resistance, and the first resistance, similarly the input of the second not gate unit connects to the output of the first not gate unit.

The buffering unit includes two-stage series-connected phase inverters.

The phase inverter includes two parallel-connected not gate units.

The power unit includes a selective amplifier which can selectively amplify the square-wave signal into a sine wave signal with the same frequency and transmit the sine wave signal to the piezoelectric ceramic lamination.

The power unit includes a MOSFET Q1, a first inductance L3, a second inductance L4, a first capacitance C6 and a second capacitance C7, and the grid electrode of the MOSFET Q1 connects to the output of the buffering unit 2, the source electrode to ground, the drain electrode to the power source by the first inductance L3, the drain electrode of the MOSFET Q1 connects to ground through the first capacitance C6, the second inductance L4 and the piezoelectric ceramic lamination, the second capacitance C7 connects to the conjunction of the first capacitance C6 and the second inductance L4.

According to another embodiment of the present invention, an atomization device comprises an ultrasonic atomization circuit comprises a driving signal generating unit to generate an ultrasonic driving signal, a power unit to amplify and transmit the ultrasonic driving signal to a piezoelectric ceramic lamination, and a buffering unit connecting to the driving signal generating unit and the power unit to reduce the effect by the load of the power unit to the driving signal generating unit, and the driving signal generating unit comprises a square-wave generating circuit formed by not gate units, and the square-wave generating circuit includes a first not gate unit and a second not gate unit, the output of the first not gate unit connects to its input sequentially through an adjustable resistance, and the first resistance, similarly the input of the second not gate unit connects to the output of the first not gate unit, the buffering unit comprises two-stage series-connected phase inverters, the phase inverter comprises two parallel-connected not gate units.

According to the embodiments of the invention, the ultrasonic atomization circuit has a character of reducing the effect by the disperse circuits and reactance to the driving signal generating unit, meanwhile need less units and easy to test.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION OF THE PREFERRED EMBODIMENTS

Figure 1:
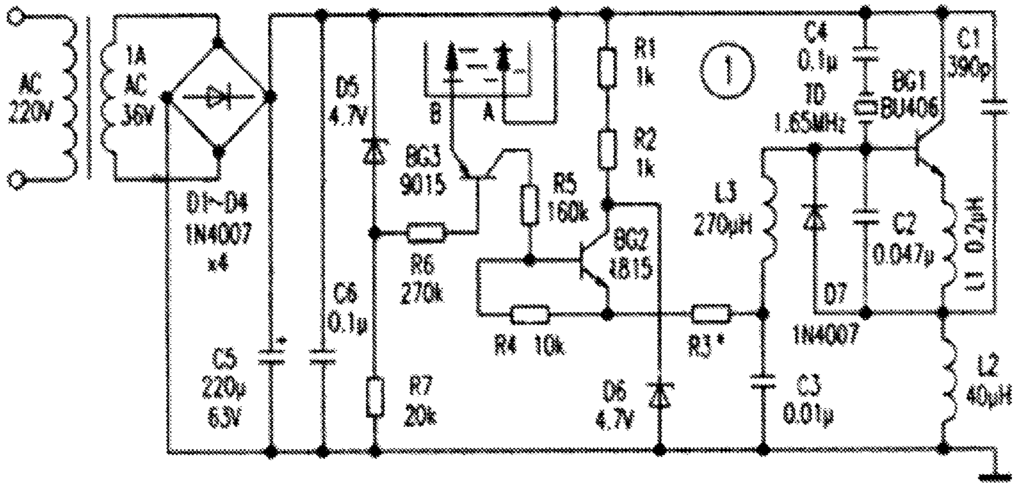
FIG. 1 is a schematic view of a traditional ultrasonic atomization circuit.
Figure 2:
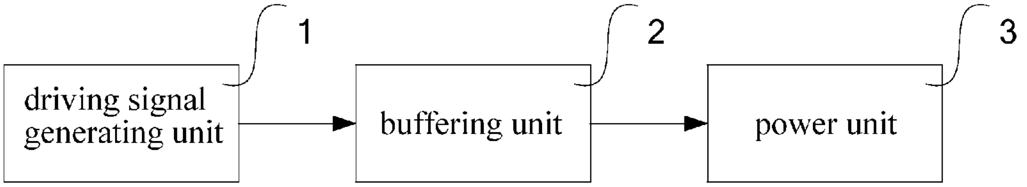
FIG. 2 is a schematic view of an ultrasonic atomization circuit according to an embodiment of the invention.

As shown in FIG. 2, an ultrasonic atomization circuit of an embodiment according to the invention is disclosed. The ultrasonic atomization circuit includes a driving signal generating unit 1, a buffering unit 2 and a power unit 3. The driving signal generating unit 1 generates an ultrasonic driving signal which is a square-wave signal with an adjustable frequency. The power unit 3 amplifies the driving signal and transmits it to a piezoelectric ceramic lamination. The buffering unit 2 is connected to the driving signal generating unit 1 and the power unit 3 to reduce the effect from the load connecting to the power unit 3 to the driving signal generating unit 1. The buffering unit 3 can not only reduce the effect by the disperse circuits and reactance to the driving signal generating unit, meanwhile but also make the reactance of the driving signal generating unit 1 and the power unit 3 to match each other. Hence, the driving signal transmitted to the power unit 3 has a little wave shape distortion to be favorable to the power unit 3.

Figure 3:
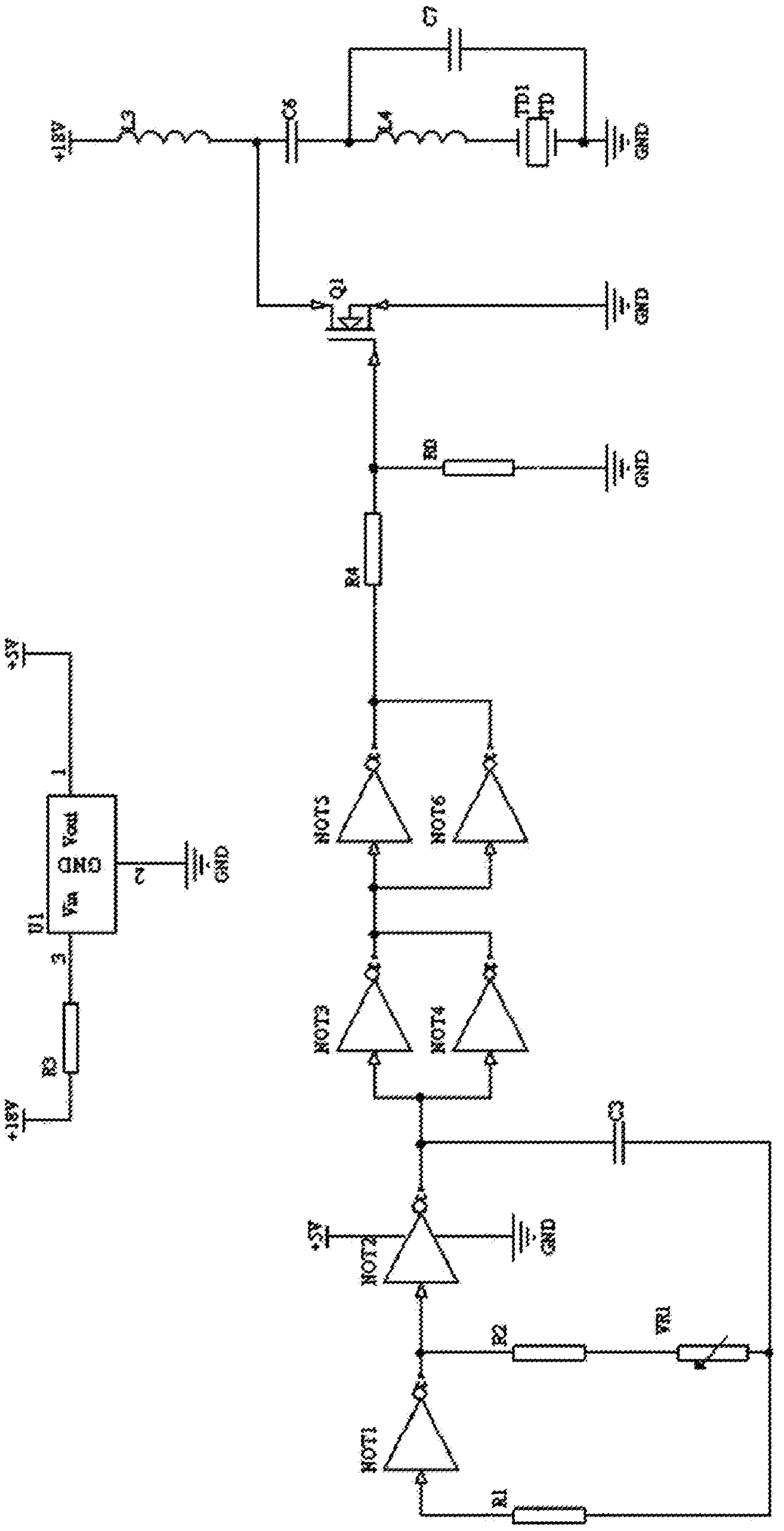
FIG. 3 is a circuit view of the ultrasonic atomization circuit of FIG. 2.

As shown in FIG. 3, the driving signal generating unit 1 includes a square-wave generating circuit, and the square-wave generating circuit includes a first not gate unit (NOT) and a second not gate unit. The output of the first not gate unit connects to its input sequentially through an adjustable resistance (VR1) and the first resistance (R1), similarly the input of the second not gate unit connects to the output of the first not gate unit. The square-wave signal is transmitted from the output of the second not gate unit to the conjunction of the adjustable resistance (VR1) and the first resistance (R1) through a capacitor (C3).

The buffering unit 2 includes two-stage series-connected phase inverters including gate circuits. The phase inverter includes two parallel-connected not gate units. A NOT3 and a NOT4 are parallel connection to form the first stage phase inverter, that is, the inputs of the NOT3 and NOT4 connect to each other, and the outputs of the NOT3 and NOT4 connect to each other. Similarly, a NOT5 and a NOT6 are parallel connection to form the second stage phase inverter, that is, the inputs of the NOT5 and NOT6 connect to each other, and the outputs of the NOT5 and NOT6 connect to each other. The input of the phase inverter connects to the output of the driving signal generating unit 1, and the output of the first stage phase inverter connects to the input of the second stage phase inverter, and the output of the second stage phase inverter connects to the input of the power unit 3.

According to the embodiment, the power unit 3 includes a selective amplifier which can selectively amplify the square-wave signal into a sine wave signal with the same frequency and transmit the sine wave signal to the piezoelectric ceramic lamination. As shown in FIG. 3, the power unit 3 includes a MOSFET METAL OXIDE SEMICONDUCTOR FIELD EFFECT TRANSISTOR Q1, a first inductance L3, a second inductance L4, a first capacitance C6 and a second capacitance C7. The grid electrode of the MOSFET Q1 connects to the output of the buffering unit 2, and the source electrode to ground, the drain electrode to the power source by the first inductance L3. The drain electrode of the MOSFET Q1 connects to ground through the first capacitance C6, the second inductance L4 and the piezoelectric ceramic lamination. The second capacitance C7 connects to the conjunction of the first capacitance C6 and the second inductance L4. The power unit includes a MOSFET, a first inductance, a second inductance, a first capacitance and a second capacitance. The grid electrode of the MOSFET connects to the output of the buffering unit, and its source electrode to ground, and its drain electrode connects to the power unit by the first inductance. Furthermore, the MOSFET connects to ground through the first capacitance, the second inductance and the piezoelectric ceramic lamination, and the second capacitance connects to the conjunction of the first capacitance and the second inductance.

According to the above description, six phase inverters, several resistor s and capacitors consists of a RC multi vibrator circuit to generate a high frequency square-wave signal. The first resistance R1 is to protect the input of the not gate unit. When the threshold voltage of the not gate unit Vth=½ VCC (most gate circuits are available for this requirement), and R2+VR1<<R1, the period of the square-wave T=2(R2+VR1)C3 ln 3=2.2(R2+VR1)C3. Different high frequency square-wave signals can be generated only to adjust the VR1. Which is emphasized, the frequency of the square-wave signal is equal to the central frequency of the piezoelectric ceramic lamination TD1.

After being generated, the high frequency square-wave is transmitted to an N-Channel power MOSFET Q1. The drain electrode of the Q1 generates an equal frequency square-wave signal, and then the square-wave signal coupled by the capacitor C6 is transmitted to a parallel resonance frequency selection network formed by the inductance L4, the piezoelectric ceramic lamination TD1, and the capacitor C7. The square-wave signal is turned into a sine signal with the same frequency.

Because the signal through the piezoelectric ceramic lamination has an equal frequency to the central frequency of the piezoelectric ceramic lamination, a resonance will appear to make the piezoelectric ceramic lamination to generate an enough high frequency signal, that is an ultrasonic, and the ultrasonic effects on water to generate atomization.

The power of the atomization device is assured by the MOSFET Q1. To adjust the adjustable resistance VR1 can change the frequency of the atomization device. When the frequency has a lager difference with the central frequency (inherent frequency) of the piezoelectric ceramic lamination, the power of the atomization device may descend. Even though there are several disperse circuits and reactance, the piezoelectric ceramic lamination can generate a resonance by only adjusting the adjustable resistance, which can keep the atomization device on the stage of maximum power.

As shown in FIG. 3, the +18V DC is provided by a power adapter. The +18V DC voltage is turned into a stable +5V DC voltage by a voltage conversion regulator chip (78L05) to supply power to the six phase inverters. Wherein the six phase inverters may be used as a 14 pins integrated logic gate circuit chip.

The ultrasonic atomization circuit has a character of reducing the effect by the disperse circuits and reactance to the driving signal generating unit, meanwhile need less units and easy to test.

According to an embodiment of this invention, an atomization device using the above ultrasonic atomization circuit is supplied. The ultrasonic atomization circuit includes a driving signal generating unit to generate an ultrasonic driving signal, a power unit to amplify and transmit the driving signal to the piezoelectric ceramic lamination, and a buffering unit connecting to the driving signal generating unit and the power unit to reduce the effect by the load of the power unit to the driving signal generating unit. The driving signal generating unit includes a square-wave generating circuit formed by not gate units. The square-wave generating circuit includes a first not gate unit (NOT) and a second not gate unit. The output of the first not gate unit connects to its input sequentially through an adjustable resistance, and the first resistance (R1), similarly the input of the second not gate unit connects to the output of the first not gate unit. The buffering unit includes two-stage series-connected phase inverters including gate circuits and the phase inverter includes two parallel-connected not gate units. The power unit includes a selective amplifier which can selectively amplify the square-wave signal into a sine wave signal with the same frequency and transmit the sine wave signal to the piezoelectric ceramic lamination.

What is claimed is:

1. An ultrasonic atomization circuit comprises a driving signal generating unit to generate an ultrasonic driving signal, a power unit to amplify and transmit the ultrasonic driving signal to a piezoelectric ceramic lamination, and a buffering unit connecting to the driving signal generating unit and the power unit to reduce the effect by the load of the power unit to the driving signal generating unit, wherein the power unit comprises a selective amplifier which can selectively amplify a square-wave signal into a sine wave signal with the same frequency and transmit the sine wave signal to the piezoelectric ceramic lamination.

2. The ultrasonic atomization circuit according to claim 1, wherein the power unit comprises a MOSFET Q1, a first inductance L3, a second inductance L4, a first capacitance C6 and a second capacitance C7, and the grid electrode of the MOSFET Q1 connects to the output of the buffering unit 2, the source electrode to ground, the drain electrode to the power source by the first inductance L3, the drain electrode of the MOSFET Q1 connects to ground through the first capacitance C6, the second inductance L4 and the piezoelectric ceramic lamination, the second capacitance C7 connects to the conjunction of the first capacitance C6 and the second inductance L4.

3. An ultrasonic atomization circuit comprises a driving signal generating unit to generate an ultrasonic driving signal, a power unit to amplify and transmit the ultrasonic driving signal to a piezoelectric ceramic lamination, and a buffering unit connecting to the driving signal generating unit and the power unit to reduce the effect by the load of the power unit to the driving signal generating unit, wherein the driving signal generating unit comprises a square-wave generating circuit formed by not gate units, and the square-wave generating circuit includes a first not gate unit and a second not gate unit, the output of the first not gate unit connects to its input sequentially through an adjustable resistance, and the first resistance, similarly the input of the second not gate unit connects to the output of the first not gate unit.

4. The ultrasonic atomization circuit according to claim 3, wherein the power unit comprises a selective amplifier which can selectively amplify the square-wave signal into a sine wave signal with the same frequency and transmit the sine wave signal to the piezoelectric ceramic lamination.

5. The ultrasonic atomization circuit according to claim 4, wherein the power unit comprises a MOSFET Q1, a first inductance L3, a second inductance L4, a first capacitance C6 and a second capacitance C7, and the grid electrode of the MOSFET Q1 connects to the output of the buffering unit 2, the source electrode to ground, the drain electrode to the power source by the first inductance L3, the drain electrode of the MOSFET Q1 connects to ground through the first capacitance C6, the second inductance L4 and the piezoelectric ceramic lamination, the second capacitance C7 connects to the conjunction of the first capacitance C6 and the second inductance L4.

6. The ultrasonic atomization circuit according to claim 3, wherein the buffering unit comprises two-stage series-connected phase inverters.

7. The ultrasonic atomization circuit according to claim 6, wherein the power unit comprises a selective amplifier which can selectively amplify the square-wave signal into a sine wave signal with the same frequency and transmit the sine wave signal to the piezoelectric ceramic lamination.

8. The ultrasonic atomization circuit according to claim 7, wherein the power unit comprises a MOSFET Q1, a first inductance L3, a second inductance L4, a first capacitance C6 and a second capacitance C7, and the grid electrode of the MOSFET Q1 connects to the output of the buffering unit 2, the source electrode to ground, the drain electrode to the power source by the first inductance L3, the drain electrode of the MOSFET Q1 connects to ground through the first capacitance C6, the second inductance L4 and the piezoelectric ceramic lamination, the second capacitance C7 connects to the conjunction of the first capacitance C6 and the second inductance L4.

9. The ultrasonic atomization circuit according to claim 6, wherein the phase inverter comprises two parallel-connected not gate units.

10. The ultrasonic atomization circuit according to claim 9, wherein the power unit comprises a selective amplifier which can selectively amplify the square-wave signal into a sine wave signal with the same frequency and transmit the sine wave signal to the piezoelectric ceramic lamination.

11. The ultrasonic atomization circuit according to claim 10, wherein the power unit comprises a MOSFET Q1, a first inductance L3, a second inductance L4, a first capacitance C6 and a second capacitance C7, and the grid electrode of the MOSFET Q1 connects to the output of the buffering unit 2, the source electrode to ground, the drain electrode to the power source by the first inductance L3, the drain electrode of the MOSFET Q1 connects to ground through the first capacitance C6, the second inductance L4 and the piezoelectric ceramic lamination, the second capacitance C7 connects to the conjunction of the first capacitance C6 and the second inductance L4.

12. An atomization device comprises an ultrasonic atomization circuit comprises a driving signal generating unit to generate an ultrasonic driving signal, a power unit to amplify and transmit the ultrasonic driving signal to a piezoelectric ceramic lamination, and a buffering unit connecting to the driving signal generating unit and the power unit to reduce the effect by the load of the power unit to the driving signal generating unit, and the driving signal generating unit comprises a square-wave generating circuit formed by not gate units, and the square-wave generating circuit includes a first not gate unit and a second not gate unit, the output of the first not gate unit connects to its input sequentially through an adjustable resistance, and the first resistance, similarly the input of the second not gate unit connects to the output of the first not gate unit, the buffering unit comprises two-stage series-connected phase inverters, the phase inverter comprises two parallel-connected not gate units.

13. The atomization device according to claim 12, wherein the power unit comprises a selective amplifier which can selectively amplify the square-wave signal into a sine wave signal with the same frequency and transmit the sine wave signal to the piezoelectric ceramic lamination.

14. The atomization device according to claim 13, wherein the power unit comprises a MOSFET, a first inductance, a second inductance, a first capacitance and a second capacitance, and the grid electrode of the MOSFET connects to the output of the buffering unit, the source electrode to ground, the drain electrode to the power source by the first inductance, the drain electrode of the MOSFET connects to ground through the first capacitance, the second inductance and the piezoelectric ceramic lamination, the second capacitance connects to the conjunction of the first capacitance and the second inductance.

* * * * *